United States Patent [19]

Iguchi

[11] 4,001,707
[45] Jan. 4, 1977

[54] AMPLIFIER CIRCUIT
[75] Inventor: Shinsuke Iguchi, Kodaira, Japan
[73] Assignee: Hitachi, Ltd., Japan
[22] Filed: July 22, 1974
[21] Appl. No.: 490,341
[30] Foreign Application Priority Data
  Jan. 11, 1974  Japan .............................. 49-5964
  Feb. 8, 1974  Japan ............................ 49-15453
[52] U.S. Cl. ................................. 330/18; 330/13;
          330/15; 330/17; 330/22; 330/26
[51] Int. Cl.² ........................................ H03F 3/04
[58] Field of Search ................. 330/13, 15, 17, 22,
          330/26, 40, 51, 27, 112

[56] References Cited
UNITED STATES PATENTS

| | | |
|---|---|---|
| 3,462,698 | 8/1969 | Yagher et al. .................... 330/18 X |
| 3,622,899 | 11/1971 | Eisenberg ........................ 330/18 X |
| 3,772,606 | 11/1973 | Waehner ......................... 330/22 X |
| 3,832,643 | 8/1974 | Van Heyningen et al. ...... 330/22 X |

Primary Examiner—R. V. Rolinec
Assistant Examiner—Lawrence J. Dahl
Attorney, Agent, or Firm—Craig & Antonelli

[57] ABSTRACT

An amplifier circuit for increasing the utilization factor of a power source comprising an output amplifier circuit, a first power source, and a second power source having a voltage of an absolute value greater than that of the first power source, so that the first and second voltages supplied to the output amplifier circuit are switched therebetween in dependence on an input signal applied to the output amplifier circuit.

6 Claims, 5 Drawing Figures

AMPLIFIER CIRCUIT

BACKGROUND OF THE INVENTION

1. Field of the Invention

The present invention relates to amplifier circuits, and is mainly devoted to a class "B" amplifier circuit composed of transistors.

2. Description of the Prior Art

The vertical deflection output circuit of a television receiver requires a vertical output deflection circuit having a large output such as a Braun tube with a wide deflection angle and a large screen diameter. A class "B" push-pull circuit has therefore been adopted as the output circuit.

The vertical deflection output circuit amplifies a vertical signal and a pulse for blanking the picture frame during the vertical retrace time, namely, the back pulse. In order to achieve the purpose mentioned above, the voltage amplitude of the back pulse must be high in comparison with that of the vertical signal. The supply voltage $V_{cc}$ of the output circuit is, accordingly, high in proportion to the required voltage of the back pulse.

At the output of the vertical deflection output circuit, however, the period during which the back pulse is provided is much shorter than the period during which the vertical signal is provided. This brings about the problem that the utilization factor of the supply voltage is extremely inferior and that the collector loss of a power transistor is very great.

As a method for solving this problem, there has hitherto been known one in which the back pulse is produced by a separate circuit and is added to the vertical signal. Since this method necessitates a pulse generator and an amplifier circuit for producing a back pulse of high voltage, the circuit arrangement becomes complicated.

On the other hand, in a sound output amplifier circuit, a class "B" amplifier circuit is generally adopted. When compared with a class "A" amplifier circuit, the class "B" amplifier circuit has a good utilization factor of the power source $$\left( \alpha = \frac{\text{output voltage supplied to load}}{\text{supply voltage}} \right)$$

and little heat generation, and hence, it is suited for a large output amplifier circuit. Even in the case of a class "B" amplifier circuit, however, the utilization factor of power source is 70% or so for a maximum output, and is sharply lowered for small outputs. For this reason, in the case of an output amplifier circuit of large output, even the class "B" amplifier circuit generates a large amount of heat creating difficulties in the design of heat radiation.

SUMMARY OF THE INVENTION

In the present specification, the expression "class 'A' amplifier circuit" shall mean an amplifier circuit which is biased substantially in the middle of the input-output characteristic of an amplifier element and in which an output current flows during the full period of a symmetric signal input. The expression "class 'B' amplifier circuit" shall mean an amplifier circuit which is biased in the vicinity of the cutoff point of the input-output characteristic of an amplifier element and in which an output current flows during substantially a half period of a symmetric signal input. Amplifier circuits which are generally called "a class 'C' amplifier circuit" and "a class 'AB' amplifier circuit" on the basis of somewhat different bias points shall be also included in the class "B" amplifier circuit. Hereunder the expression "amplifier circuit" in this specification shall mean such a class "B" amplifier circuit.

It is an object of the present invention to raise the utilization factor of such an amplifier circuit.

Another object of the present invention is to provide a push-pull amplifier circuit the circuit arrangement of which is simple and the utilization factor of which of the supply voltage is raised.

PREFERRED EMBODIMENTS OF THE INVENTION

The present invention will now be concretely explained along its embodiments with reference to the accompanying drawings.

Figure 1:
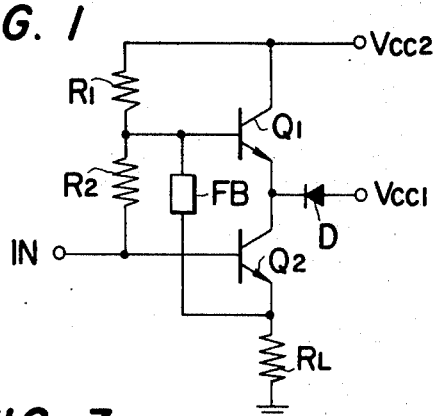
FIGS. 1 and 2 are circuit diagrams each showing an embodiment of the amplifier circuit according to the present invention.

FIG. 1 shows an amplifier circuit according to the present invention. An amplifier transistor $Q_2$ is driven by supply voltages dependent upon the levels of the input signals. More specifically, when the level of the input signal is small, the amplifier transistor $Q_2$ is driven by a low supply voltage $V_{cc1}$, while when the level of the input signal is large and an output voltage at this time cannot be attained by the low supply voltage $V_{cc1}$, the supply voltage is switched to a high supply voltage $V_{cc2}$ to drive the amplifier transistor $Q_2$. In order to automatically effect the switching between the supply voltages $V_{cc1}$ and $V_{cc2}$ in response to the levels of the input signals, the amplifier circuit is constructed as below. A switching transistor $Q_1$ for feeding the high supply voltage $V_{cc2}$ is connected in series with the amplifier transistor $Q_2$. On the input side of the transistor $Q_1$, bias resistances $R_1$ and $R_2$ are provided. First, when the input signal is lower than a specified level, that is, when an output voltage for the input signal is attainable by the low supply voltage $V_{cc1}$, the transistor $Q_1$ is turned "off" by the bias means and the input signal level, and the low supply voltage $V_{cc1}$ is fed through a diode D to the amplifier transistor $Q_2$. Next, when the input signal is higher than the specified level, the transistor $Q_1$ is turned "on" by the input signal. Simultaneously therewith, the output signal of the amplifier transistor $Q_2$ is positively fed-back by positive feedback means FB to speedily bring the transistor $Q_1$ into the saturation state and to supply the high supply voltage $V_{cc2}$ to the amplifier transistor $Q_2$. At this time, the diode D is reverse-biased by the high supply voltage $V_{cc2}$, and is automatically turned "off."

In the above embodiment, when the input signal level is low and the output voltage to be fed to a load $R_L$ is low, the low supply voltage $V_{cc1}$ is used, while when the input signal level is high and the output voltage to be fed to the load $R_L$ exceeds the low supply voltage $V_{cc1}$, the supply voltage is automatically switched to the high supply voltage $V_{cc2}$ in response to the input signal level. Therefore, the utilization factor of power source can be enhanced.

Figure 2:
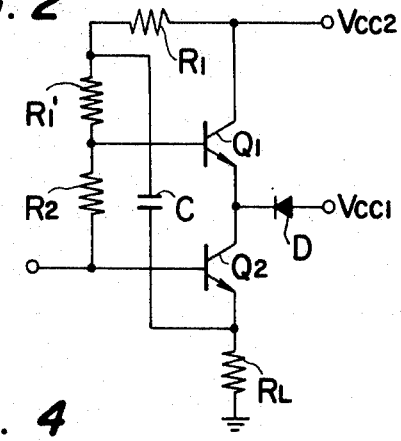

As the positive feedback means FB in the amplifier circuit shown in FIG. 1, there are such conductive elements as a resistance, diode, Zener diode and a transistor. With these elements, however, the input side and the output side of the amplifier transistor $Q_2$ cannot be separated DC-wise, and bias design is therefore difficult. For this reason, a bootstrap capacitor C is employed as the positive feedback means FB as illustrated in FIG. 2. Then, the input and output sides of the amplifier transistor $Q_2$ can be separated DC-wise, so that the bias design of the switching transistor $Q_1$ is facilitated and that the degree of freedom of the design increases.

Figure 3:
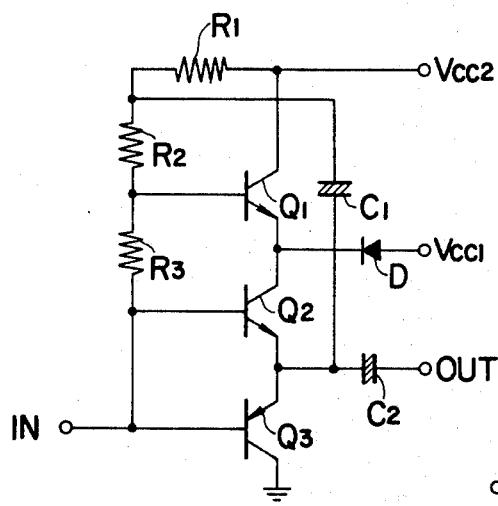
FIG. 3 is a circuit diagram where the present invention is applied to a push-pull amplifier circuit.
Figure 4:
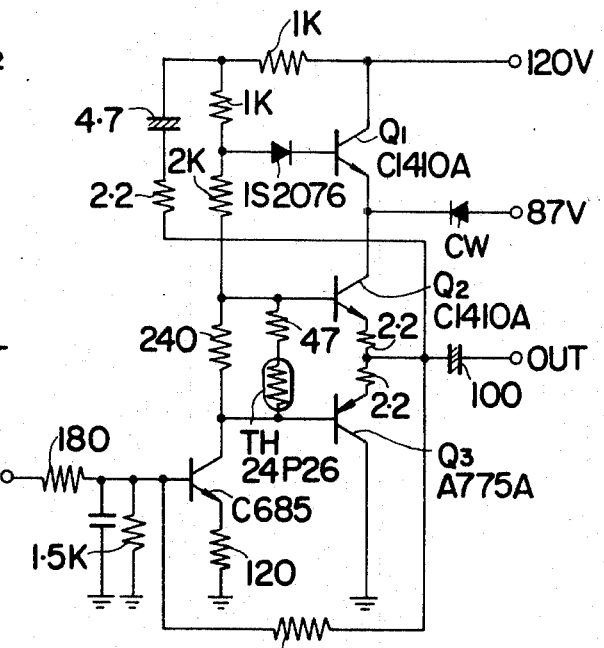
FIG. 4 is a circuit diagram of a concrete example of circuit which was designed in measuring the power dissipation of the amplifier circuit of the present invention.
Figure 5:
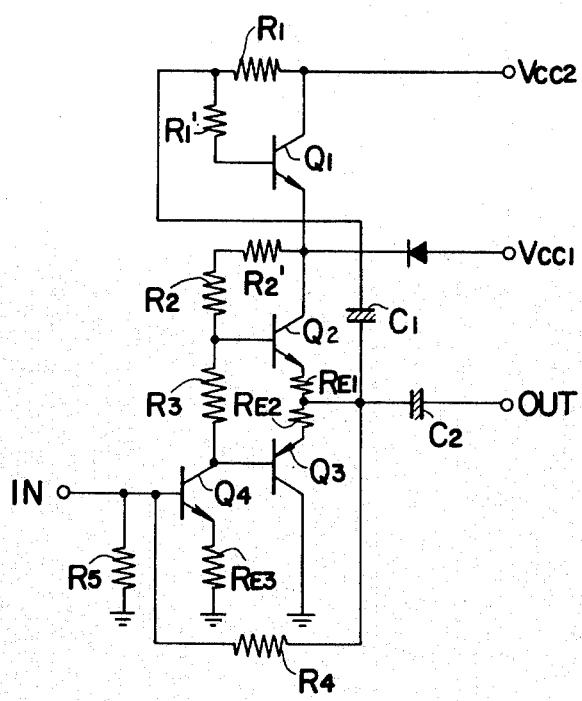
FIG. 5 is a circuit diagram showing a further embodiment of the present invention.

FIGS. 3 to 5 illustrate a case where the present invention is applied to a push-pull amplifier circuit. As is shown in FIG. 3, the amplifier circuit grounds the power source terminal of one of transistors $Q_2$ and $Q_3$ constituting a push-pull output circuit, namely, the collector of the transistor $Q_3$. To the power source terminal of the other, namely, the collector of the transistor $Q_2$, either a low supply voltage $V_{cc1}$ or a high supply voltage $V_{cc2}$ is fed according to the input signal level of the push-pull circuit. The switching between the supply voltages $V_{cc1}$ and $V_{cc2}$ is effected as explained below.

For input signals in the range of output signal levels attainable by the supply voltage $V_{cc1}$, transistor $Q_1$ is turned "off", and the supply voltage $V_{cc1}$ is fed through a diode D. Where the levels of the output signals for input signals exceed the supply voltage $V_{cc1}$, the transistor $Q_1$ is turned "on" by the input signal at that time, and the higher supply voltage $V_{cc2}$ is supplied. Herein, the diode D is reverse-biased for $|V_{cc2}| > |V_{cc1}|$, and it is automatically turned "off". The base voltage of the transistor $Q_1$ is set by resistances $R_1$–$R_3$ so as to effect the above operation.

As will be explained below with reference to FIG. 4, the resistances $R_1$–$R_3$ function as the load of the driving transistor. In this connection, in order to obtain a sufficient value for the amplification factor of the driving circuit, the values of the resistances must be large. However, when the resistance values are large, the current is insufficient to cause the switching operation of the transistor $Q_1$. In order to make the amplification of the driving circuit sufficient and simultaneously to speedily bring the transistor $Q_1$ into the saturation region, it is desirable to provide a bootstrap circuit composed of, for example, a capacitor $C_1$.

Where the amplifier circuit of the foregoing embodiment is employed in, for example, the vertical deflection output circuit of a television receiver, the circuit arrangement becomes very simple as apparent from FIG. 3. Furthermore, in a period in which the back pulse is absent, that is, where the vertical signal is amplified, the transistor $Q_1$ turns "off" and the diode D turns "on" and the transistors $Q_2$ and $Q_3$ are thus operated as the usual class "B" complementary circuit by the low supply voltage $V_{cc1}$, so that the utilization factor of this circuit for the supply voltage $V_{cc1}$ can be enhanced. In a period in which the back pulse is present, the base voltage $V_B$ of the transistor $Q_1$ becomes higher than the supply voltage $V_{cc1}$, the transistor $Q_1$ turns "on", and the high supply voltage $V_{cc2}$ is fed to the complementary circuit. The diode D with the supply voltage $V_{cc2}$ applied thereto, is reverse-biased and therefore turns "off", so that the supply voltage is automatically switched from that $V_{cc1}$ to that $V_{cc2}$. The transistor $Q_1$ carries out only the on-off operation as stated above, with only a slight collector loss.

The diminution of the collector loss of the power transistor in the foregoing case where the present invention is applied to the vertical deflection output circuit of a television receiver will become apparent from the results of an experiment to be discussed below.

FIG. 4 shows a concrete circuit which was designed in performing the experiment. The measurements of the collector losses of the transistors $Q_1$–$Q_3$ were carried out in such way that radiator plates were attached to the transistors and temperatures were measured. As a result, according to the present invention, the collector losses were 0.4 W for the transistor $Q_1$, approximately 0.3 W for $Q_2$ and approximately 0.3 W for $Q_3$. In comparison with driving the prior-art complementary circuit $Q_2$ and $Q_3$ by 120 V where the collector losses were approximately 5 W for $Q_2$ and approximately 5 W for $Q_3$, the invention could reduce the power dissipation by about 40%.

In FIG. 4, a diode is connected to the base of the transistor $Q_1$. When the transistor $Q_1$ is "off" a reverse voltage is applied across its base-emitter circuit, and hence, the diode serves to increase the breakdown voltage.

The present invention is not restricted to the foregoing embodiments, but it can adopt various aspects of performance.

For example, as is shown in FIG. 5, the load resistance of the driving transistor $Q_4$ and the bias resistance of the switching transistor $Q_1$ may be separate, and the driving transistor $Q_4$ may be driven by the lower supply voltage $V_{cc1}$. In this case, the collector loss of the transistor $Q_4$, being a class "A" amplifier circuit, can also be diminished, and a driver current to flow through the transistor $Q_4$ can be increased. With this circuit, therefore, it becomes possible to employ even a power transistor whose current gain $h_{FE}$ is small.

In addition to the pure complementary circuit illustrated in the foregoing embodiments, the push-pull circuit may be one of any form, for example, a quasi-complementary circuit.

Further, the bootstrap circuit may be a Zener diode instead of a capacitor. In short, any means may be employed insofar as it provides positive feedback.

Still further, a plurality of transistors corresponding to, for example, the switching transistor $Q_1$ in FIG. 1 or FIG. 3 may be connected in series according to input signal levels, and a plurality of power sources may be provided in correspondence with them. In this case, the power source for feeding an intermediate voltage must have a diode or the like, corresponding to the switching diode D, connected thereto. It will be necessary that a diode or the like for raising the base-emitter withstand voltage be connected to the base of the switching transistor.

The present invention is extensively applicable as an amplifier circuit. The foregoing push-pull circuit according to the present invention can be extensively utilized, not only as a vertical deflection output circuit of a television receiver, but also as an amplifier circuit for asymmetric signals of a plurality of input levels, for example, pulse signals.

While we have shown and described several embodiments in accordance with the present invention it is understood that the same is not limited thereto but is susceptible of numerous changes and modifications known to a person skilled in the art and we therefore do not wish to be limited to the details shown and described herein but intend to cover all such changes and modifications as are obvious to one of ordinary skill in the art.

What is claimed is:

1. A circuit comprising:
   an input terminal to which input signals to be amplified are coupled;
   an output terminal from which output signals are derived;
   an amplifier circuit connected between said input and output terminals, for amplifying said input signals and supplying the amplified signals at said output terminal;
   a first supply voltage terminal for supplying a first supply voltage to said amplifier circuit;
   a second supply voltage terminal for supplying a second supply voltage to said amplifier circuit, the absolute value of said second supply voltage being greater than the absolute value of said first supply voltage;
   first switching circuit means, connected between said first supply voltage terminal and said amplifier circuit, for coupling said first supply voltage to said amplifier circuit in response to said input signals being below a prescribed level and decoupling said first supply voltage to said amplifier circuit in response to said input signals being at least said prescribed level;
   second switching circuit means which includes a control input, connected between said second supply voltage terminal and said amplifier circuit, for coupling said second supply voltage to said amplifier circuit in response to said input signals being at least at said prescribed level and decoupling said second supply voltage to said amplifier circuit in response to said input signals being below said prescribed level;
   first resistive means connected between said second supply voltage terminal and said control input of said second switching circuit means;
   second resistive means connected between said control input of said second switching circuit means and said input terminal; and
   positive feedback means connected between said output terminal and said control input of said second switching circuit means.

2. A circuit according to claim 1, wherein said first switching circuit means comprises a diode.

3. A circuit comprising:
   an input terminal to which input signals to be amplified are coupled;
   an output terminal from which output signals are derived;
   an amplifier circuit connected between said input and output terminals, for amplifying said input signals and supplying the amplified signal at said output terminal;
   a first supply voltage terminal for supplying a first supply voltage to said amplifier circuit;
   a second supply voltage terminal for supplying a second supply voltage to said amplifier circuit, the absolute value of said second supply voltage being greater than the absolute value of said first supply voltage;
   first switching circuit means, connected between said first supply voltage terminal and said amplifier circuit, for coupling said first supply voltage to said amplifier circuit in response to said input signals being below a prescribed level;
   second switching circuit means which includes a control input, connected between said second supply voltage terminal and said amplifier circuit, for coupling said second supply voltage to said amplifier circuit in response to said input signals being at least at said prescribed level;
   first and second resistive means connected in series between said second supply voltage terminal and said control input of said second switching circuit means;
   third resistive means connected between said control input of said switching circuit means and said input terminal; and
   a capacitor for providing positive feedback connected between said output terminal and the connection point of said first and second resistive means.

4. A circuit according to claim 3, wherein said first switching means comprises a diode.

5. A circuit comprising:
   an input terminal to which input signals to be amplified are coupled;
   driving means having a control input electrode connected to said input terminal, a first output electrode connected to a fixed reference potential, and a second output electrode from which output signals are derived;
   a complementary transistor push-pull amplifier circuit having an input terminal connected to said second output electrode of said driving means, a first power source terminal which is coupled to said fixed reference potential, a second power source terminal, and an output terminal at which the emitters of the complementary push-pull transistors are coupled together, and supplying its output signals to said output terminal;
   a first supply voltage terminal for supplying a first supply voltage to said push-pull amplifier circuit;
   a second supply voltage terminal for supplying a second supply voltage to said driving means and push-pull amplifier circuit, the absolute value of said second supply voltage being greater than the absolute value of said first supply voltage;
   first switching circuit means, connected between said first supply voltage terminal and said second power source terminal of said push-pull amplifier circuit, for coupling said first supply voltage to said push-pull amplifier circuit in response to said input signals being below a prescribed level;
   second switching circuit means which includes a control input, connected between said second supply voltage terminal and said second power source terminal of said push-pull amplifier circuit, for coupling said second supply voltage to said push-pull amplifier circuit in response to said input signals being at least at said prescribed level;
   first and second resistive means connected in series between said second supply voltage terminals and said control input of said second switching circuit means;

third resistive means connected between said control of said switching circuit and said second output eletrode of said driving means; and a capacitor for providing positive feedback connected between said output terminal and the connection point of said first and second resistive means.

6. A circuit comprising:

an input terminal to which input signals to be amplified are coupled;

driving means having a control input electrode connected to said input terminal, a first output electrode connected to a fixed reference potential, and a second output electrode from which output signals are derived;

a complementary transistor push-pull amplifier circuit having an input terminal connected to said second output electrode of said driving means, a first power source terminal which is coupled to said fixed reference potential and, a second power source terminal, and an output terminal at which the emitters of the complementary push-pull transistors are coupled together, and supplying its output signals to said output terminal;

a first supply voltage terminal for supplying a first supply voltage to said driving means and push-pull amplifier circuit;

a second supply voltage terminal for supplying a second supply voltage to said driving means and push-pull amplifier circuit, the absolute value of said second supply voltage being greater than the absolute value of said first supply voltage;

first switching means, connected between said first supply voltage terminal and said second power source terminal of said push-pull amplifier circuit, for coupling said first supply voltage to said driving means and said push-pull amplifier circuit in response to said input signals being below a prescribed level;

second switching circuit means which incldudes a control input, connected between said second supply voltage terminal and said second power source terminal of said push-pull amplifier circuit, for coupling said second supply voltage to said driving means and said push-pull amplifier circuit in response to said input signals being at least at said prescribed level;

first resistive means connected between said input terminal of said push-pull amplifier circuit and said second power source terminal of said push-pull amplifier circuit;

second and third resistive means connected in series between said second supply voltage terminals and said control input of said second switching circuit means;

a capacitor for providing positive feedback connected between said output terminal and said connection point of said first and second resistive means.

* * * * *